United States Patent [19]

Kumakhov

[11] Patent Number: 5,175,755

[45] Date of Patent: Dec. 29, 1992

[54] USE OF A KUMAKHOV LENS FOR X-RAY LITHOGRAPHY

[75] Inventor: Muradin A. Kumakhov, Moscow, U.S.S.R.

[73] Assignee: X-Ray Optical System, Inc., Voorheesville, N.Y.

[21] Appl. No.: 678,603

[22] Filed: Apr. 1, 1991

Related U.S. Application Data

[63] Continuation-in-part of Ser. No. 678,208, Apr. 1, 1991, which is a continuation-in-part of Ser. No. 607,456, Oct. 31, 1990.

[51] Int. Cl.$^5$ .................................................. G21K 5/00
[52] U.S. Cl. ............................................ 378/34; 378/35
[58] Field of Search ...................................... 378/34, 35

[56] References Cited

U.S. PATENT DOCUMENTS

5,016,267  5/1991  Wilkins ................................. 378/34

Primary Examiner—Janice A. Howell
Assistant Examiner—Don Wong
Attorney, Agent, or Firm—Lieberman, Rudolph & Nowak

[57] ABSTRACT

An X-ray lithography device which utilizes a Kumakhov lens is disclosed. This device is capable of using both small area sources and synchrotron sources. This device provides improved X-ray control, precision and accuracy. Also provided is a method of X-ray lithograph which incorporates a Kumakhov lens.

26 Claims, 4 Drawing Sheets

USE OF A KUMAKHOV LENS FOR X-RAY LITHOGRAPHY

This application is a continuation in-part of U.S. Ser. No. 678,208, filed Apr. 1, 1991, which in turn is a continuation-in-part of U.S. Ser. No. 607,456, filed Oct. 31, 1990, both of which are hereby incorporated by reference.

BACKGROUND OF THE INVENTION

X-ray lithography utilizes a variety of sources including X-rays emitted from a small area (point-sources) and synchrotron generated X-rays to generate an image. Unfortunately, X-ray lithographic systems have been limited by the inability to adequately manipulate the X-ray beam.

X-ray optics incur several difficulties not encountered in the visible or infra-red (IR range). Refraction in passing through media of a different refractive index cannot be used because of the strong absorption of photons with sufficient energy to excited or ionize electronic levels inside the media. Diffraction and interference phenomena can be used to deflect X-rays using Bragg scattering in single crystals, in multi-layer mirrors or by using zone and phase plates. Although these approaches are useful in many applications, they are very energy (wave length) selective and cannot be used to control X-ray beams having a broad energy spectrum. The use of reflection has also been limited because surfaces of all known materials have very low reflection coefficients for X-radiation at large angles of incidence.

Grazing-incidence optics have been developed based on the phenomenon of total external reflection of X-rays. This is widely used in synchrotron radiation facilities where flat mirrors are used for deflection and curved mirrors are used for focusing parallel beams. These mirrors typically use a single reflection. Such devices have an extremely small angular aperture due to the small value of the total-external-reflection angle (milliradians at KeV energies). Point-source X-ray lithography using existing equipment is limited by the following:

Intensity. The sources currently in development lack the intensity to achieve an exposure time which approaches production requirements. Modifications attempted to increase intensity are not only expensive, but by pushing the sources harder potentially decrease reliability, reduce source life and increase debris generation at the source which can damage the mask.

Radial magnification. Because the beam from the source to the mask is divergent there is increasing distortion as the edge of the field is reached. Distortion may be reduced by adjusting the feature size and shape in the mask. Unfortunately, as gap tolerance becomes more critical, mask and wafer flatness requirements increase, alignment becomes increasingly difficult, field size is limited, and the same masks cannot be used on a synchrotron.

Penumbral blur. The sources have a size large enough that illumination of the mask by different points of the x-ray generating area produce a blurring of the features projected on to the wafer. This lack of definition in the edge of the images projected limits the achievable minimum feature size.

Source position instability. To the extent that X-ray spots are not be in the exact same position each pulse, feature patterns projected on the resist have decreased definition.

Synchrotron-source X-ray lithography is not intensity limited and has a beam which does not show significant divergence of any significance in the vertical direction. The beam, however, is very flat, normally 0.5–2.0 mm thick, is horizontal, and has a divergence in the horizontal plane which can be 6 degrees or larger. Because the beam is flat and the area to be exposed can be multiples of a cm square, either the wafer and mask must be moved to get a scan or a mirror in the beam line must be rotated to cause the beam to scan across the desired area. Horizontal beams require that the masks and wafer be vertical rather than horizontal as is more commonly used with optical steppers. The horizontal beam divergence causes the majority of the beam to be wasted with only a small portion of the beam reaching the mask and wafer at the end of the long beam lines.

The subject invention provides a solution to the long felt need in the art for an improved system of X-ray lithography. The subject invention provide the benefits of improved X-ray control, precision and accuracy.

SUMMARY OF THE INVENTION

The subject invention provides an X-ray lithographic system comprising a Kumakhov lens. An X-ray source is required and the Kumakhov lens is typically located between X-ray source and a mask.

The X-ray source may be a point source or a non-point source, such as a synchrotron. A Kumakhov lens may also be located between a mask and a resist. The subject invention also teaches a method for X-ray lithography, which comprises: providing a source of radiation; focusing the radiation from the source through a Kumakhov lens; and passing the focused radiation through a mask. This method may also add a Kumakhov lens to form a quasi-parallel beam and a second Kumakhov lens to focus the beam into a preselected band of energies.

DETAILED DESCRIPTION OF THE INVENTION

The subject invention overcomes the traditional difficulties in controlling X-rays by using multiple small-angle (i.e., less than the critical angle) reflections to direct radiation. By using specially shaped surfaces, including hollow capillaries, multiple reflection has been demonstrated to control X-ray beams over wide frequency and angular ranges. Most Kumakhov lenses to date have been made of large numbers of curved hollow capillaries. Using a Kumakhov lens between the X-ray source and the mask-wafer combination provides control over beam shape, intensity, direction, and energy distribution.

The subject system includes a Kumakhov lens which controls X-ray beams by multiple reflections along very smooth boundaries of condensed media which have special shapes which ensure that a sufficient portion of the beam never makes a reflection at an angle larger than the critical angle of total external reflection. Use of windows and choice of vacuum or gaseous medium for the system or portions of the system is consistent with this invention.

POINT SOURCE X-RAY LITHOGRAPHY

Figure 1:
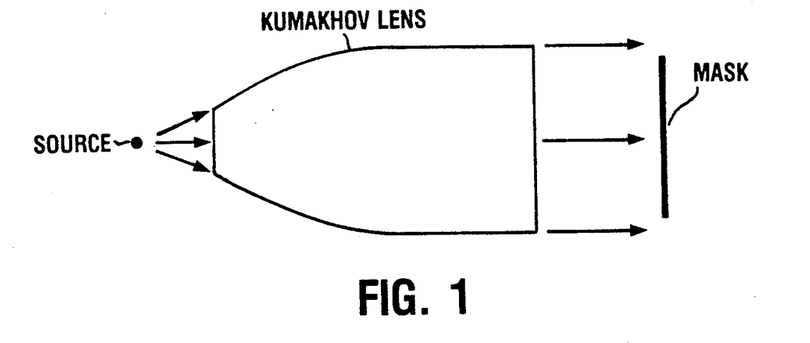
FIG. 1: A schematic representation of a system showing a source, a Kumakhov lens and a mask. X-rays generated at the source transverse the Kumakhov lens, and proceed to the mask.
Figure 2:
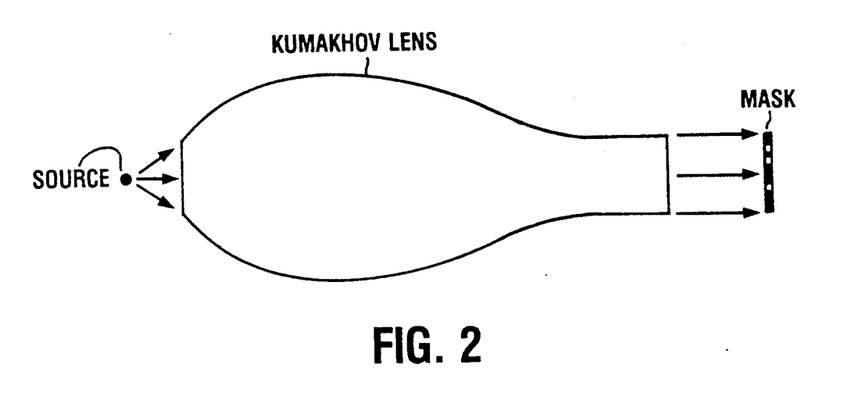
FIG. 2: A schematic representation of a system showing a source, a Kumakhov lens and a mask. X-rays generated at the source transverse the Kumakhov lens, and proceed to the mask. The beam exiting the Kumakhov lens is narrower than in FIG. 1.

For point-source X-ray lithography, the Kumakhov lens selected is one capable of capturing a divergent beam and focusing that X-ray beam into a quasi-parallel beam oriented at the mask. FIGS. 1 and 2 represent examples of the invention. FIG. 2 is the preferred embodiment for most applications because it delivers a higher intensity beam. The lens may be constructed using any multi-layer structure where the X-rays reflect at angles less than the critical angle, but the recommended embodiment is to use bent tubes such as capillaries or bundles of capillaries. Capillaries may vary in a inner diameter and may have submicron exit diameters. The cross-section of the lens can vary, but will normally be the shape of the area to be exposed on the mask and wafer with the exit end of the lens sized a little larger than the area to be exposed. The tube sections of the Kumakhov lens may be extended different distances on the butt end of the lens to control the intensity across the beam section. In another embodiment, the tubes may be non-uniformly spaced to control beam intensity or may be flared. The system can be designed so the lens redirects the beam along a different axis, but this is not usually desirable since it causes a decrease in beam intensity and alternative beam orientation can be achieved by a design which places the source and lens in another location.

Figure 3A:
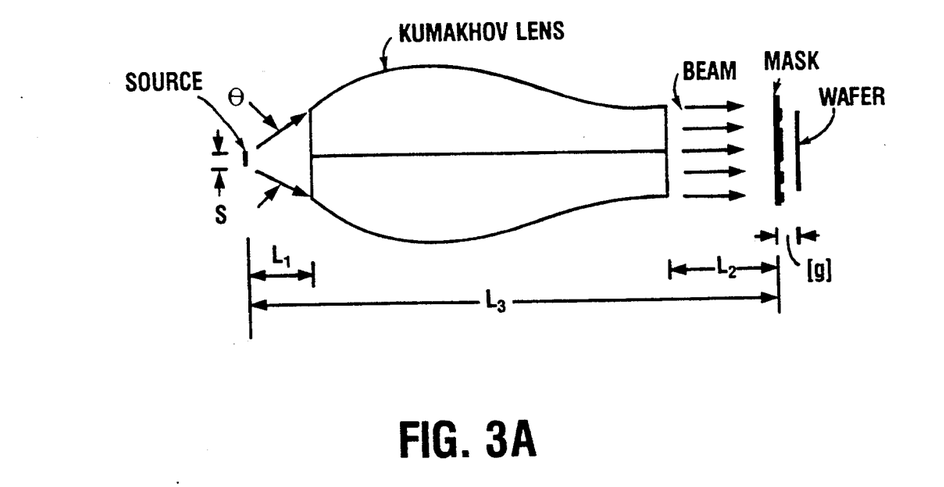
FIG. 3A: A schematic representation of a system having a source, a Kumakhov lens, a mask and a wafer.
  g = mask/wafer gap
  $\theta$ = lens capture angle (sr)
  $\delta$ = radial magnification
Figure 3B:
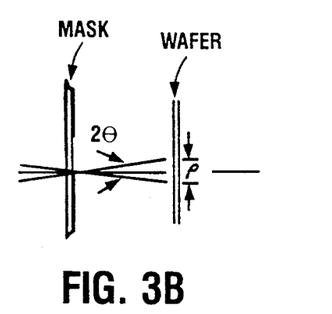
FIG. 3B: Shows a schematic representation of the X-rays traversing the mask and hitting the wafer.
  $\theta$ = maximum beam divergence from axis
  $\rho$ = penumbral blur

By use of the subject system (see FIG. 3) several benefits are obtained:

(1) Increased intensity without pushing sources to their limit. Because the source output is collected over the solid angle $\phi$, more of the source power is transmitted to the wafer. And because the lens output is close to parallel, the distance to the mask is not as critical because the beam intensity does not drop off with the square of the distance.

(2) Elimination of radial magnification because the beam is uniform in direction and divergence across its cross section. This reduces sensitivity to gap control between mask and wafer; reduces sensitivity to mask and wafer flatness; and avoids need to compensate for run-out when constructing the mask.

(3) Increased field size. The field size is not limited by radial magnification or parallax and can be controlled by the design of the lens to meet the requirements. Lenses with 7 cm×7 cm beams or greater are producible.

(4) Decreased penumbral blur. $p = 2 \sin \theta$, independent of S, $L_1$, $L_2$, and $L_3$. The penumbral blur can be further decreased by using lens channels such as capillaries which are flared at the end, thereby reducing $\theta$.

(5) Decreased sensitivity to source position instability. Because the lens accepts X-rays from the same image focal area and focuses X-rays in the same direction, even if the source position were to shift and effect the intensity delivered to the mask, the geometric relationship between beam direction, mask and wafer would not be affected.

(6) Separation of source from mask. Not only does the production of a quasi-parallel beam by a Kumakhov Lens allow the sample and source to be separated by a large distance, it also physically separates the source and sample so that line of sight transmission of material evaporated or sputtered from the source does not get onto the mask or sample. This is particularly serious for electron beam and laser sources and can also be a problem with plasma sources. Even a small amount of contaminant on a sample can be disastrous and on a thin mask can seriously degrade the performance and shorten the useful lifetime of the mask.

(7) Selected band width. A Kumakhov lens can filter out undesirable photon energies. Filtering out higher energy photons is normally very difficult. But by using the Kumakhov lens energy photons can be filtered out and by using a reflection angle which exceeds the Fresnel angle (critical angle of total external reflection) of the high energy photons. This selective filtering is possible as the Fresnel angle decreases as photon energy increases.

Figure 4:
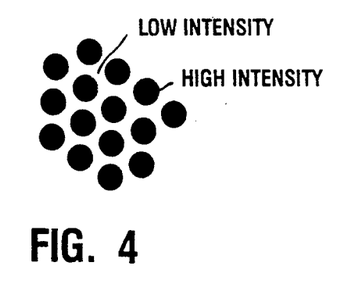
FIG. 4: A representation of the magnified beam cross-section taken at a position to the butt end of the lens.

Because there are discrete channels in the lens, the intensity of X-rays exiting the lens have some variations across the cross-section as shown in FIG. 4 for a lens composed of circular capillary channels. This may be corrected by positioning the lens sufficiently far from the mask for the small angular beam divergence from each channel to homogenize the intensity across the lens cross section. Alternatively, the lens may be rotated. These methods of achieving microhomogeneity with Kumakhov lenses are discussed more completely in the parent patent application. Because portions of the X-ray beam exiting the lens farthest from the center axis of the lens are typically at lower intensity due to the lens geometries, modifications to the lens such as selectively lengthening channels, or using of a filter, can be made to avoid a drop in intensity in the beam at increasing distance from the center axis of the beam.

SYNCHROTRON-SOURCE X-RAY LITHOGRAPHY

Figure 5A:
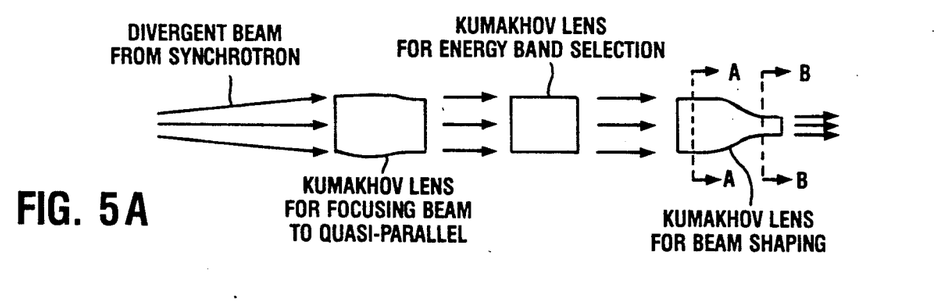
FIG. 5A: A schematic representation of a system which uses a divergent beam synchrotron, a Kumakhov lens for focusing the beam to quasi-parallel, a Kumakhov lens for energy band reflection and Kumakhov lens for beam shaping.
Figure 5B:
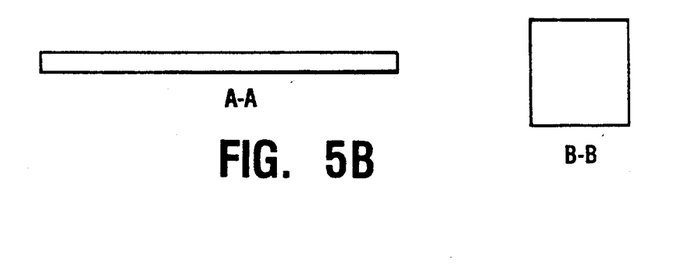
FIG. 5B: A representation of the beam cross-section taken along planes A—A and B—B.
Figure 6A:
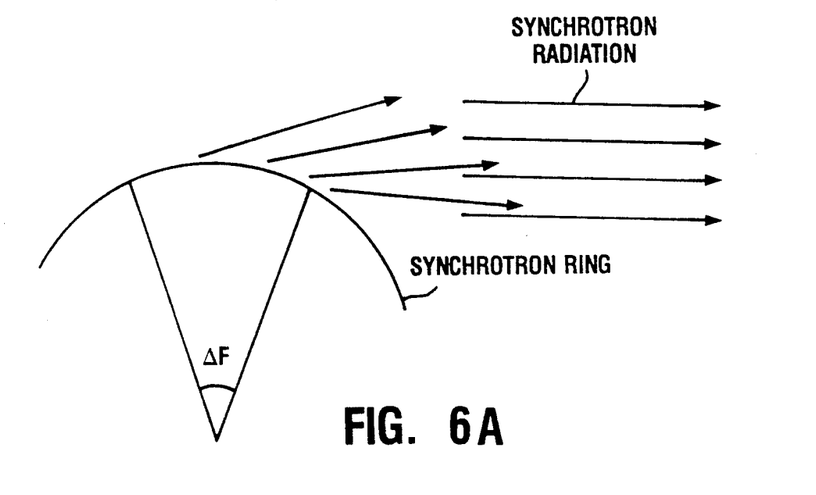
FIG. 6A: A representation of synchrotron radiation coming off a synchrotron ring.
Figure 6B:
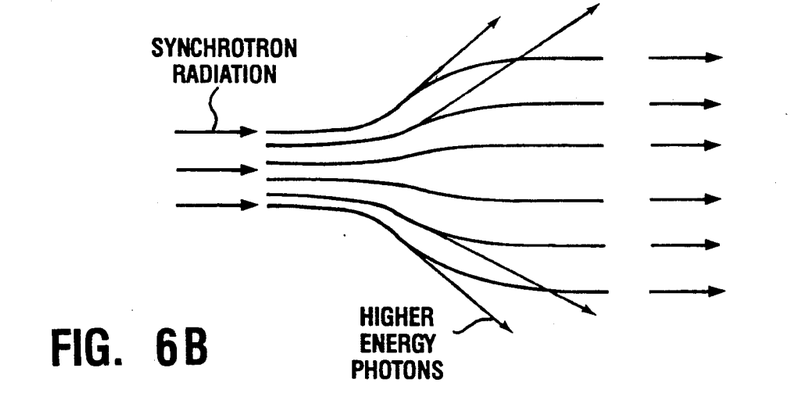
FIG. 6B: Represents the transformation of synchrotron radiation into a large cross-section with small divergence and filtration of higher energy photons.

The synchrotron-source designed X-ray lithography system uses a Kumakhov lenses or lens to capture a divergent beam and focus it into a quasi-parallel beam, or reshape the beam to expose a more two dimensional area without needing to scan, redirect the beam to another orientation, split the beam into multiple orientations, select a portion of the energy band, or combinations of these by using complex lenses or combinations of lenses (FIG. 5).

(1) Tailoring beam shape and increasing of beam efficiency. The photon beam from a synchrotron is a fan shaped beam, typically about 6 degrees in angular width in the horizontal direction and about 1 mm in height in the vertical direction. The sample to be irradiated is typically 2×2 cm currently, but could increase to 4×4 cm with improvements in mask design. By using a Kumakhov lens, beam shape can be changed from the fan to a quasi-parallel beam of appropriate size and shape for the sample. This avoids the necessity to sweep the beam or move the sample in order to cover the sample area. It also allows the entire sample to be irradiated simultaneously and not sequentially. Under current design, the beam line for X-ray lithography using low energy X-rays must be at least 10 meters in length to provide sufficient distance to allow fast acting valves to close and to isolate the electron storage ring ultra high vacuum from vacuum accidents at the sample. This means that only a small percentage of the fan is incident on the sample. With a Kumakhov Lens, more than 25 percent of the fan can be incident on the sample at any one time, taking into account transmission losses in the lens.

(2) Changing beam direction. Since the beam from a synchrotron is in the shape of a thin horizontal fan, it is necessary for the sample-mask combination to be vertical so that it is perpendicular to the beam. In many optical lithography processing lines it is standard for wafers to proceed through the processing line horizontally, where the mask alignment and stepping has been designed for horizontal operation. Transformation to vertical positioning is non-trivial because of the thin masks and precise positioning needed for X-ray lithography. It is possible by using a Kumakhov lens to convert the X-ray beam from a horizontal to a vertical direction. There will undoubtedly be absorption losses involved but the total transmission efficiency is expected to be greater than 10%.

(3) Switching of synchrotron beam. The use of Kumakhov lenses to control direction and deflection of X-ray beams allows beams to be directed more flexibly into different lines or different positions on the same line. Concern has been expressed about the dependence of synchrotron based X-ray lithography on reliability of the accelerator and storage ring. To avoid unscheduled interruptions, it may be necessary to have two storage rings in operation simultaneously, then if one goes down the other can still deliver X-rays. The problem is how to serve the same lithography station from either or both of two storage rings. The Kumakhov lens can be used for such switching operations.

(4) Selecting energy band. Because the energy desired for any particular X-ray lithography process is much narrower than the very broad energy spectrum from a synchrotron, incorporating a Kumakhov lens to control the energies transmitted is beneficial. The control can be exercised through selective absorption by choice of the lens materials and selective transmission by selective of the lens design parameters. Filtering out higher energy photons is normally very difficult. But by using Kumakhov lens described in the parent application, higher energy photons can be filtered out by using a reflection angle which exceeds the Fresnel angle (critical angle of total external reflection) of the high energy photons. This selective filtering is possible as the Fresnel angle decreases as the photon energy increases. This results in very effective filtration. For example, if energies higher than 1 keV are not desired, it is possible by this method to filter out about 96% of 2 keV photons while only reducing 1 keV intensity by about 15% to 20%.

The considerations which apply to synchrotron-source based X-ray lithography would also be applicable if non-point-source X-ray lithography sources become available.

PROJECTION X-RAY LITHOGRAPHY

Projection X-ray lithography refers to X-ray lithography where there is a demagnification between the mask and the image on the resist. This enables the features on the mask to be larger than the features of the device created from the image. Known projection X-ray lithography efforts are in the research stage with no devices demonstrating feasibility for commercial use. Much current effort focuses on devices which would use multiple reflections from multi-layer curved mirrors. This method would use electromagnetic radiation in the vacuum ultra violet or very low energy X-ray spectra. The primary problem is the extreme difficulty of making curved mirrors of the multi-layer materials with the requisite smoothness.

Figure 7:
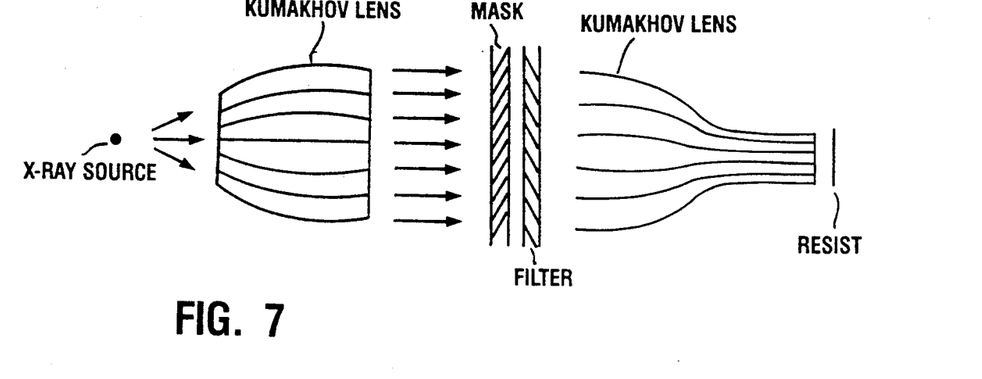
FIG. 7: A schematic representation of projected lithography including an X-ray source, a first Kumakhov lens, mask filter, a second Kumakhov lens and a resist.

The subject invention for projection X-ray lithography is based on capillary optics. FIG. 7 shows an embodiment using an isotropic source. After the source there is a Kumakhov lens, which transforms divergent radiation into a quasi-parallel beam; this beam falls on a pattern or mask, passes through a filter, a second Kumakhov lens, and then falls on the resist. The filter is not required, but enhances performance by making the beam striking the resist uniform across its cross-section. Without correction, the beam would be weaker further from the central axis because capillaries there are bent over a larger angle, leading to higher beam losses. Such a filter could be placed either between the first lens and the mask or between the mask and the second Kumakhov lens as shown in FIG. 7. Other methods of achieving beam uniformity may also be utilized.

Figure 8:
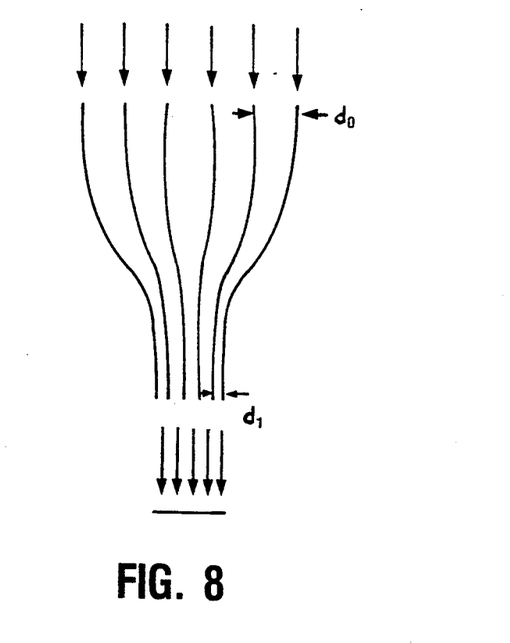
FIG. 8: A representation of the second Kumakhov lens for projection lithography.

FIG. 8 shows a Kumakhov lens between the mask and resist the capillaries decrease in diameter. The preferred embodiment is for the inner diameter of the capillaries to decrease from $d_0$ to $d_1$. It is also possible to have some or all of the reduction in total cross-section be from a reduction in the wall thickness between capillaries. However, it is very difficult to construct such a lens where the wall thicknesses decrease more rapidly than the inner diameters. Theoretically, it is possible to have capillaries of constant diameter which are positioned spaced apart at the entrance end and close packed at the exit end of the lens.

To use this device for submicron lithography, it is necessary that $d_1$ be a fraction of the feature size desired. The minimum value of $d_1$ cannot be less than c/wp where c is the speed of light and wp is the plasma frequency of the capillary's material. The value of c/wp is approximately 100 Å. If $d_1$ is too small the diffractive divergence becomes too large. For example, if the situation was X-rays at $E=1$ keV and $\lambda$ (wavelength)$=12$ Å, $d_1=120$ Å then the diffractive divergence, $\theta$ would be about $10^{-2}$ rad, ($\theta = \lambda/d_1$). It is not necessary that the capillaries have a circular cross-section.

The resist should be placed at a distance from the Kumakhov lens, which is equal to or greater than $L=d/\theta$ where d is the thickness of the capillary walls and $\theta$ is the divergence of the beam leaving the Kumakhov lens. This condition is necessary for mixing beams from neighboring capillaries. At the same time L should not be so great as to prevent mixing of beams from capillaries which are located far from each other.

Such a device can also be used with a synchrotron as a source. In some cases when using a synchrotron source it may be possible to not use a Kumakhov lens before the mask. However, the preferred embodiment is where there is a Kumakhov lens between the synchrotron source and mask. As mentioned elsewhere in this patent, this lens can be used for reshaping the cross-section of the beam, redirecting the beam, controlling divergence, and controlling the energy band width.

Another embodiment is where the mask or pattern in FIG. 7 is not a separate element by is incorporated into the end of the Kumakhov lens or into the Kumakhov lens.

Upon reading the above specification, variations and alternative embodiments will become obvious to one skilled in the art and are to be considered within the scope and spirit of the subject invention. The subject invention is only to be limited by the claims which follow and their equivalents.

What is claimed is:

1. An X-ray lithographic system comprising a Kumakhov lens.

2. A system of claim 1, wherein the Kumakhov lens is located between an X-ray source and a mask.

3. A system of claim 2, wherein the X-ray source is a point source.

4. A system of claim 2, wherein the X-ray source is a non-point source.

5. A system of claim 4, wherein the X-ray source is a synchrotron providing a horizontally divergent beam.

6. A system of claim 3, wherein the Kumakhov lens captures a divergent beam produced by the X-ray source and focuses it into a quasi-parallel beam.

7. A system of claim 3, wherein the Kumakhov lens has channeling elements of compound curvature which capture a divergent beam produced by the X-ray source and focus it into a quasi-parallel beam of higher intensity.

8. A system of claim 1, wherein the Kumakhov lens comprises a plurality of bent tubes.

9. A system of claim 8, wherein at least one bent tube is a bundle of capillaries.

10. A system of claim 2, where the lens to mask distance is sufficient to homogenize any difference in beam intensity caused by the discrete pattern of the tubes and capillaries.

11. A system of claim 2, wherein the X-ray source produces a beam and a filter is used to control the beam intensity across the beam cross-section.

12. A system of claim 5, wherein the Kumakhov lens collects the horizontally divergent beam and focuses it into a quasi-parallel beam.

13. A system of claim 1, wherein the Kumakhov lens performs energy band selection.

14. A system of claim 13, wherein the energy band selection is accomplished by selective absorption.

15. A system of claim 13, wherein the energy band selection is accomplished by selective transmission.

16. A system of claim 2, wherein the Kumakhov lens modifies the cross-section of a beam produced by the X-ray source.

17. A system of claim 2, wherein the Kumakhov lens changes the direction of a beam produced by the X-ray source.

18. A system of claim 2, wherein the Kumakhov lens splits a beam produced by the X-ray source.

19. A system of claim 1, where the Kumakhov lens is located between a mask and a resist.

20. A system of claim 19, wherein the Kumakhov lens reduces the cross-section of a beam.

21. A system of claim 19 further comprising a point source, a Kumakhov lens capable of capturing a divergent beam emitted by the point source, means for holding the mask, and a Kumakhov lens capable of reducing beam cross-section.

22. A system of claim 19, wherein the mask is incorporated into a Kumakhov lens in the system.

23. A method for X-ray lithography, which comprises: providing a source of radiation; focusing the radiation from the source through a Kumakhov lens; and passing the focused radiation through a mask.

24. A method of claim 23 further comprising passing the radiation exiting the mask through a filter and through a second Kumakhov lens to narrow the beam, then contacting the radiation with a resist.

25. A method for X-ray lithography, which comprises: providing a source of radiation; focusing the radiation from the source through a Kumakhov lens to form a quasi-parallel beam; focusing the quasi-parallel beam through a second Kumakhov lens to form a beam having an energy within a preselected band; and passing the beam through a mask.

26. A method of claim 25 further comprising focusing the beam having an energy that is within a preselected band through a third Kumakhov lens to produce a beam having preselected shape prior to passing the beam through a mask.

* * * * *

(12) EX PARTE REEXAMINATION CERTIFICATE (6174th)
United States Patent
Kumakhov (10) Number: US 5,175,755 C1
(45) Certificate Issued: *Apr. 8, 2008

(54) USE OF A KUMAKHOV LENS FOR X-RAY LITHOGRAPHY

(75) Inventor: Muradin A. Kumakhov, Moscow (SU)

(73) Assignee: X-Ray Optical Systems, Inc., Voorheesville, NY (US)

Reexamination Request:
No. 90/005,772, Jul. 17, 2000

Reexamination Certificate for:
| | |
|---|---|
| Patent No.: | 5,175,755 |
| Issued: | Dec. 29, 1992 |
| Appl. No.: | 07/678,603 |
| Filed: | Apr. 1, 1991 |

(*) Notice: This patent is subject to a terminal disclaimer.

Related U.S. Application Data

(63) Continuation-in-part of application No. 07/678,208, filed on Apr. 1, 1991, now Pat. No. 5,192,869, which is a continuation-in-part of application No. 07/607,456, filed on Oct. 31, 1990, now abandoned.

(51) Int. Cl.
*G21K 5/04* (2006.01)
*G21K 5/00* (2006.01)

(52) U.S. Cl. .................... 378/34; 378/35
(58) Field of Classification Search ............ 375/34, 375/35, 84, 85, 145
See application file for complete search history.

(56) References Cited

U.S. PATENT DOCUMENTS

| | | | | |
|---|---|---|---|---|
| 3,821,510 A | 6/1974 | Muncheryan | ............ | 219/121 L |
| 3,979,621 A | 9/1976 | Yates | ............ | 313/105 |
| 3,979,637 A | 9/1976 | Siegmund | ............ | 315/12 R |
| 4,266,548 A | 5/1981 | Davi | ............ | 128/303.1 |
| 4,287,425 A | 9/1981 | Elliott, Jr. | ............ | 250/445 |
| 4,418,689 A | 12/1983 | Kanazawa | ............ | 128/6 |
| 4,583,539 A | 4/1986 | Karlin et al. | ............ | 128/303.1 |
| 4,669,467 A | 6/1987 | Willett et al. | ............ | 128/303.1 |
| 4,780,903 A | 10/1988 | Soezima | ............ | 378/145 |
| 4,788,975 A | 12/1988 | Shturman et al. | ............ | 128/303.1 |
| 4,887,282 A | 12/1989 | Mueller | | |
| 4,950,939 A | 8/1990 | Tosswill | ............ | 313/103 |
| 4,987,582 A | 1/1991 | Webster et al. | ............ | 378/85 |
| 5,001,737 A | 3/1991 | Lewis et al. | ............ | 378/147 |
| 5,016,267 A | 5/1991 | Wilkins | ............ | 378/84 |
| 5,192,869 A * | 3/1993 | Kumakhov | ............ | 250/505.1 |
| 5,497,008 A | 3/1996 | Kumakhov | ............ | 250/505.1 |

FOREIGN PATENT DOCUMENTS

| | | |
|---|---|---|
| DE | 18 03 806 B | 6/1970 |
| DE | 240 091 A1 | 10/1986 |
| GB | 1 227 929 | 4/1971 |
| GB | 1 474 955 | 5/1977 |
| JP | 42-21460 | 10/1967 |
| JP | 56-067806 | 6/1981 |
| JP | 59-072052 | 4/1984 |
| JP | 5-27840 | 1/1985 |
| JP | 60-033227 | 2/1985 |
| JP | 62-106352 | 5/1987 |
| JP | 7-40080 | 12/1987 |
| JP | 01-185497 | 7/1989 |
| JP | 7-11600 | 1/1990 |
| JP | 02-216100 | 8/1990 |
| SU | 1322888 A1 | 7/1984 |

(Continued)

OTHER PUBLICATIONS

Kumakhov, M.A., "Radiation of Channeled Particles in Crystals", Moskow, Energoatomizdat, p. 35, second paragraph from the bottom, (1986).

(Continued)

*Primary Examiner*—David V. Bruce (57) ABSTRACT

An X-ray lithography device which utilizes a Kumakhov lens is disclosed. This device is capable of using both small area sources and synchrotron sources. This device provides improved X-ray control, precision and accuracy. Also provided is a method of X-ray lithograph which incorporates a Kumakhov lens.

FOREIGN PATENT DOCUMENTS

| SU | 1551666 A1 | 4/1988 |
|---|---|---|
| SU | 1597009 A1 | 9/1988 |
| SU | 1769623 A1 | 12/1989 |
| SU | 1776149 A1 | 2/1990 |
| SU | 1702811 A1 | 4/1990 |
| WO | WO 88/01428 | 2/1988 |

OTHER PUBLICATIONS

Kumakhov, M.A., "Channeling of Photons and New X–Ray Optics", *Nuclear Instruments and Methods In Physics Research, B48,* pp. 283–286, (Mar. 1990).

Kapany, N.S., "Fiber Optics Principles and Applications", *Academic Press Inc.,* pp. 137–138, (1967).

Kovantsev, V. E. et al., "X–Ray Probe Version of Local X–Ray Spectral Method of Analysis", the I.V. Kurchatov Institute of Atomic Energy, pp. 1–5 (1991).

Dr. Woldseth, "X–Ray Energy Spectrometry", Kevex Corporation, pp. 41–42, 70, 81, Figure 2.28, p. 83 and p. 130 (1973).

*Encyclopedia of Modern Machinery. Automatization of production and industrial electronics,* vol. 3, Moscow, Soviet Encyclopedia, pp. 275–275 (1964)—partial translation of pp. 274–275 provided with portion of Russian enclycopedia.

"The IV–th All–Union Conference on Interaction of Radiation with Solids", *Book of Abstracts,* pp. 1–187 (May 15–19, 1990). Elbrus settlement, Kabardino–Balkarian ASSR, USSR.

Kumakhov; Irradiation of Charged Particles In Crystals (Energoatomizdat, Moscos 1986) p. 36—RUSSIAN.

Arkadjev; Poverkhn. Fiz. Khim. Mekh. No. 2 pp. 44–47 (1987)—RUSSIAN.

Arkadjev; Pis'ma Zh; Tekh vol. 14 pp. 97–98 (1988)—RUSSIAN.

Excerpt from the Book of Abstracts from the "III–rd All–Union Conference on Radiation of Relativistic Particles in Crystals," May 25–30, 1988, in Naltchik, pp. 174–223.

V.F. Kovantzev, The III All–Union Conference on Radiation of Relativistic Particles in Crystals, May 25–30, 1988, Naltchik, Book of Abstracts, pp. 214–215.

V.F. Kovantzev, The III All–Union Conference on Radiation of Relativistic Particles in Crystals, May 25–30, 1988, Naltchik, USSR, pp. 214–215.

V.A. Arcadiev, A.P. Kolomijtsev, M.A. Kumakhov ao. Wideband X–ray Optics with Large Angular Aperture. Uspekhi Fiz. Nauk, 1989, vol. 157, Issue 3, pp. 529–537.

M.A. Kumakhov and F.F. Komarov. Multiple Reflection from Surface X–ray Optics. Physics Reports, A review Section of Physics Letters, vol. 191, No. 6, Aug. 1990, North Holland Amsterdam, pp. 290–350.

Reports, A review Section of Physics Letters, vol. 191, No. 6, Aug. 1990, North Holland Amsterdam, pp. 290–350.

The 5$^{th}$ All–Union Conference on Interaction of Radiation with Solids. Book of Abstracts, May 15–19, 1990, Elbrus settlement, Kabardino–Balkarian, USSR.

V.A. Arcadiev, A.P. Kolomijtsev, M.A. Kumakhov ao. Design a Wideband System for Focusing Hard X–rays. Preprint IAE 4711/3, Moscow, Atominform, 1988.

Electronics. Encyclopedic Dictionary. "Soviet Encyclopedy". Moscow, 1990, pp. 254–257.

* cited by examiner

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 25 and 26 is confirmed.

Claims 1–3, 6, 8, 11, 16, 17 and 23 are cancelled.

Claims 4, 7, 9, 10, 13, 18, 19 and 24 are determined to be patentable as amended.

Claims 5, 12, 14, 15 and 20–22, dependent on an amended claim, are determined to be patentable.

New claims 27–55 are added and determined to be patentable.

4. [A] *An X-ray lithographic* system [of claim 2,] *comprising a Kumakhov lens located between an X-ray source and a mask* wherein the X-ray source is a non-point source.

7. [A] *An X-ray lithographic* system [of claim 3,] *comprising a Kumakhov lens located between an X-ray source and a mask, wherein the x-ray source is a point source, and* wherein the Kumakhov lens has channeling elements of compound curvature which capture a divergent beam produced by the X-ray source and focus it into a quasi-parallel beam of higher intensity.

9. [A] *An X-ray lithographic* system [of claim 8,] *comprising a Kumakhov lens, wherein the Kumakhov lens comprises a plurality of bent tubes and* wherein at least one bent tube [is] *comprises* a bundle of capillaries.

10. [A] *An X-ray lithographic* system [of claim 2, where] *comprising a Kumakhov lens located between an X-ray source and a mask, wherein* the lens to mask distance is sufficient to homogenize any difference in beam intensity caused by the discrete pattern of the tubes and capillaries.

13. A system of claim [1] *9*, wherein the Kumakhov lens performs energy band selection.

18. [A] *An X-ray lithographic* system [of claim 2] *comprising a Kumakhov lens located between an X-ray source and a mask*, wherein the Kumakhov lens splits a beam produced by the X-ray source.

19. [A] *An X-ray lithographic* system [of claim 1] *comprising a Kumakhov lens*, wherein the Kumakhov lens is located between a mask and a resist.

24. [A method of claim 23] *A method for X-ray lithography, which comprises: providing a source of radiation; focusing the radiation from the source through a Kumakhov lens; and passing the focused radiation through a mask; and* further comprising passing the radiation exiting the mask through a filter and through a second Kumakhov lens to narrow the beam, then contacting the radiation with a resist.

*27. An X-ray lithographic system comprising a Kumakhov lens, wherein the Kumakhov lens comprises a plurality of channels wherein at least one of the channels comprises a bundle of capillaries.*

*28. The system of claim 27, wherein the Kumakhov lens is located between an X-ray source and a mask.*

*29. The system of claim 28, wherein the X-ray source is a point source.*

*30. The system of claim 28, wherein the X-ray source is a non-point source.*

*31. The system of claim 30, wherein the X-ray source is a synchrotron providing a horizontally divergent beam.*

*32. The system of claim 29, wherein the Kumakhov lens captures a divergent beam produced by the X-ray source and focuses it into a quasi-parallel beam.*

*33. The system of claim 29, wherein the Kumakhov lens has channeling elements of compound curvature which capture a divergent beam produced by the X-ray source and focus it into a quasi-parallel beam of higher intensity.*

*34. The system of claim 28, wherein the lens to mask distance is sufficient to homogenize any difference in beam intensity caused by the discrete pattern of the bundle of capillaries.*

*35. The system of claim 28, wherein the X-ray source produces a beam and a filter is used to control the beam intensity across the beam cross-section.*

*36. The system of claim 31, wherein the Kumakhov lens collects the horizontally divergent beam and focuses it into a quasi-parallel beam.*

*37. The system of claim 27, wherein the Kumakhov lens performs energy band selection.*

*38. The system of claim 37, wherein the energy band selection is accomplished by selective absorption.*

*39. The system of claim 37, wherein the energy band selection is accomplished by selective transmission.*

*40. The system of claim 28, wherein the Kumakhov lens modifies the cross-section of a beam produced by the X-ray source.*

*41. The system of claim 28, wherein the Kumakhov lens changes the direction of a beam produced by the X-ray source.*

*42. The system of claim 28, wherein the Kumakhov lens splits a beam produced by the X-ray source.*

*43. The system of claim 27, wherein the Kumakhov lens is located between a mask and a resist.*

*44. The system of claim 43, wherein the Kumakhov lens reduces the cross-section of a beam.*

45. The system of claim 43, further comprising a point source, a Kumakhov lens capable of capturing a divergent beam emitted by the point source, means for holding the mask, and a Kumakhov lens capable of reducing beam cross-section.

46. The system of claim 43, wherein the mask is incorporated into a Kumakhov lens in the system.

47. A method for X-ray lithography, which comprises: providing a source of radiation; focusing the radiation from the source through a Kumakhov lens, the Kumakhov lens comprising a plurality of channels wherein at least one of the channels comprises a bundle of capillaries; and passing the focused radiation through a mask.

48. The method of claim 47, further comprising passing the radiation exiting the mask through a filter and through a second Kumakhov lens to narrow the beam, then contacting a resist with the radiation.

49. A method for X-ray lithography, which comprises: providing a source of radiation; focusing the radiation from the source through a Kumakhov lens to form a quasi-parallel beam; focusing the quasi-parallel beam through a second Kumakhov lens to form a beam having an energy within a preselected band; and passing the beam through a mask; wherein at least one of the first and the second Kumakhov lenses comprises a plurality of channels and wherein at least one of the channels comprises a bundle of capillaries.

50. The method of claim 49, further comprising focusing the beam having an energy that is within a preselected band through a third Kumakhov lens to produce a beam having preselected shape prior to passing the beam through a mask.

51. An x-ray lithographic system comprising a Kumakhov lens, wherein the Kumakhov lens comprises a plurality of channels wherein each channel comprises a tubular channel-forming element.

52. The system as recited in claim 51, wherein each tubular channel-forming element comprises bent hollow tubes.

53. The system as recited in claim 51, wherein each tubular channel-forming element comprises a plurality of interconnected capillaries.

54. The system as recited in claim 53, wherein the interconnected capillaries are grouped into bundles.

55. The system as recited in claim 54, wherein the bundles of capillaries have external surfaces and wherein the bundles of capillaries are rigidly fitted to one another by their external surfaces.

* * * * *